(12) United States Patent
Hsieh

(10) Patent No.: US 7,078,349 B2
(45) Date of Patent: Jul. 18, 2006

(54) METHOD TO FORM SELF-ALIGNED FLOATING GATE TO DIFFUSION STRUCTURES IN FLASH

(75) Inventor: Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 140 days.

(21) Appl. No.: 10/631,842

(22) Filed: Jul. 31, 2003

(65) Prior Publication Data

US 2005/0023596 A1 Feb. 3, 2005

(51) Int. Cl.
*H01L 21/311* (2006.01)

(52) U.S. Cl. .............................. 438/700; 257/E21.852; 257/E21.295; 257/316; 438/295; 438/400

(58) Field of Classification Search ................ 257/314, 257/315; 438/142, 261, 267, 287, 400, 700; H01L 21/311
See application file for complete search history.

(56) References Cited

U.S. PATENT DOCUMENTS

| | | | |
|---|---|---|---|
| 5,278,438 A * | 1/1994 | Kim et al. ................... | 257/316 |
| 5,330,938 A | 7/1994 | Camerlenghi ................ | 437/57 |
| 5,688,705 A | 11/1997 | Bergemont ................... | 437/43 |
| 5,851,881 A * | 12/1998 | Lin et al. ..................... | 438/261 |
| 6,245,685 B1 | 6/2001 | Sung et al. .................. | 438/719 |
| 6,271,143 B1 * | 8/2001 | Mendicino .................. | 438/700 |
| 6,358,796 B1 | 3/2002 | Lin et al. ..................... | 438/257 |
| 6,403,494 B1 | 6/2002 | Chu et al. .................... | 438/719 |
| 6,753,569 B1 * | 6/2004 | Lin et al. ..................... | 257/314 |

* cited by examiner

*Primary Examiner*—David Nelms
*Assistant Examiner*—Dao H. Nguye
(74) *Attorney, Agent, or Firm*—Thomas, Kayden, Worstemeyer & Risley

(57) ABSTRACT

A self-aligned conductive region to active region structure is disclosed in which parallel active regions of a semiconductor region of a substrate, which extends to a surface, are separated by STI regions. The STI regions have an insulator liner layer grown over their sides and are filled with an insulator filler layer. Equally spaced gate insulator regions, formed prior to the STI regions, are disposed over the active regions and overlap a portion of the insulator liner layer. Conductive regions, formed prior to the STI regions, are disposed over the gate insulator regions.

48 Claims, 20 Drawing Sheets

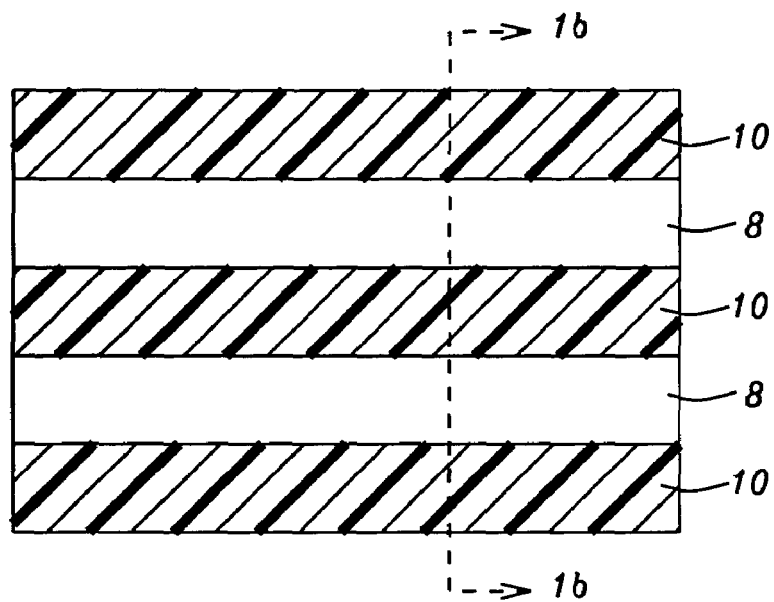
FIG. 1a – Prior Art
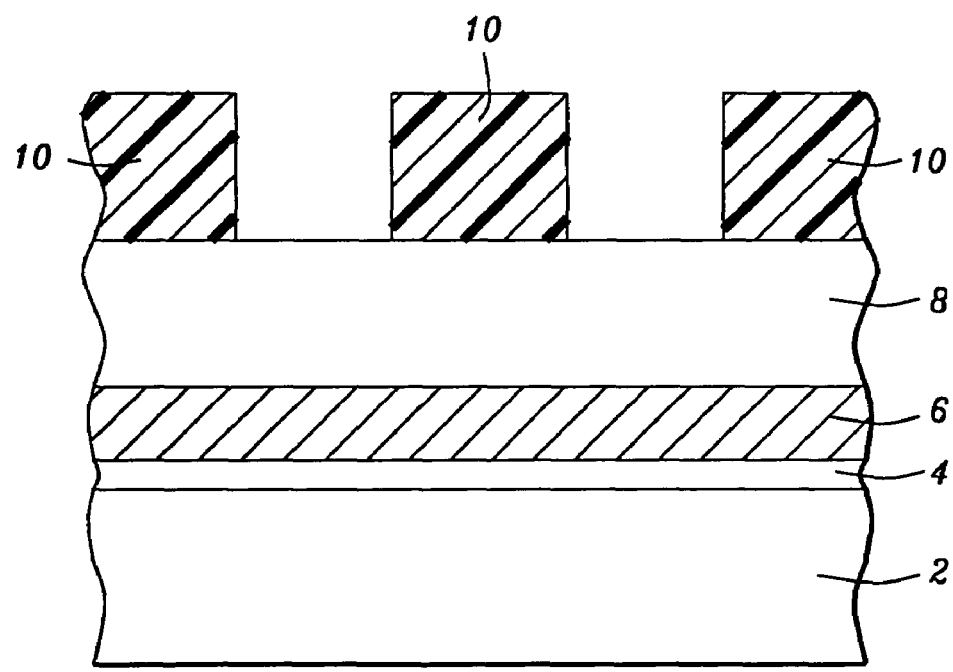
FIG. 1b – Prior Art

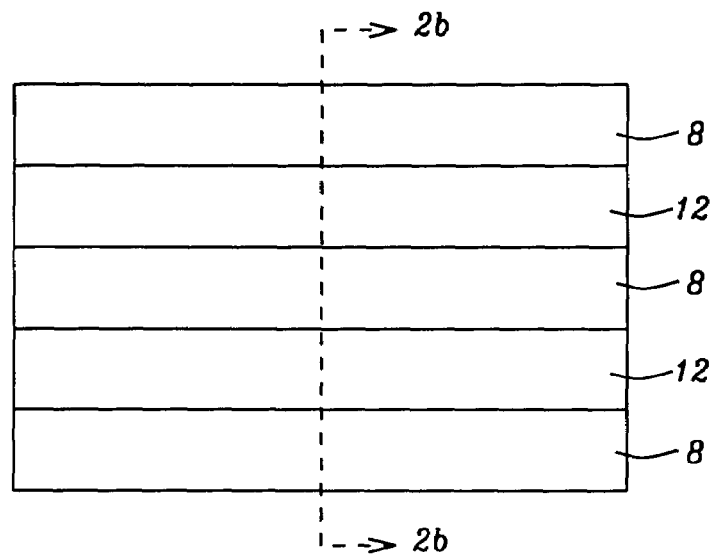
FIG. 2a – Prior Art
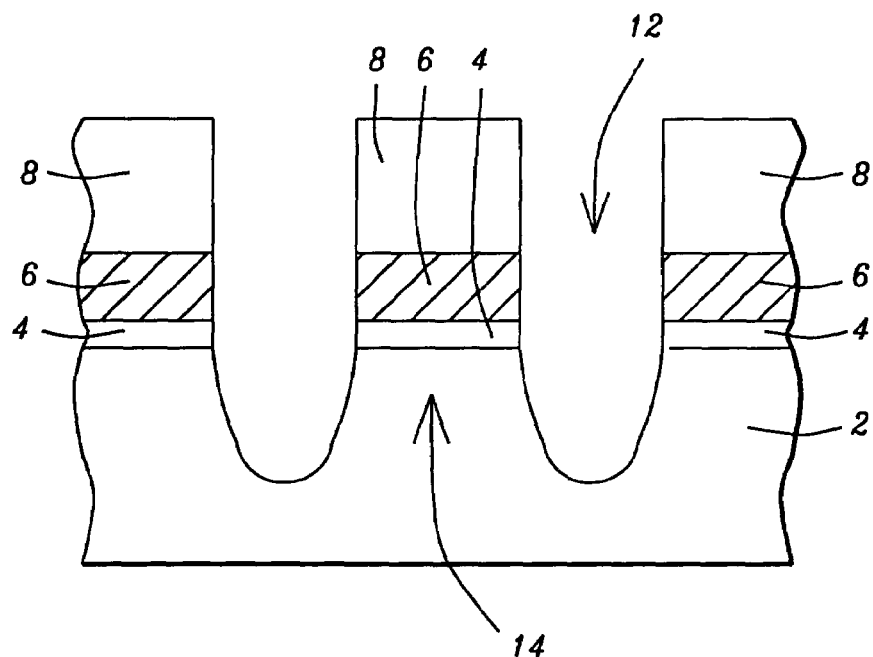
FIG. 2b – Prior Art

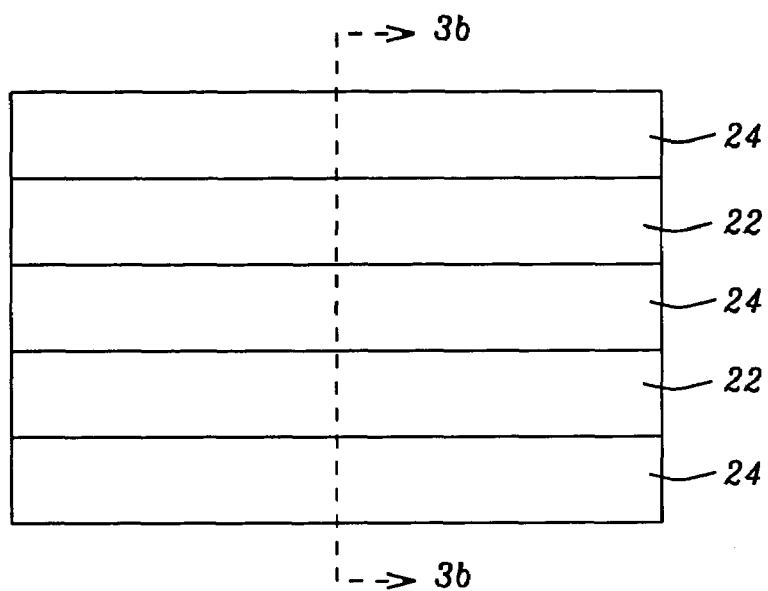
FIG. 3a - Prior Art
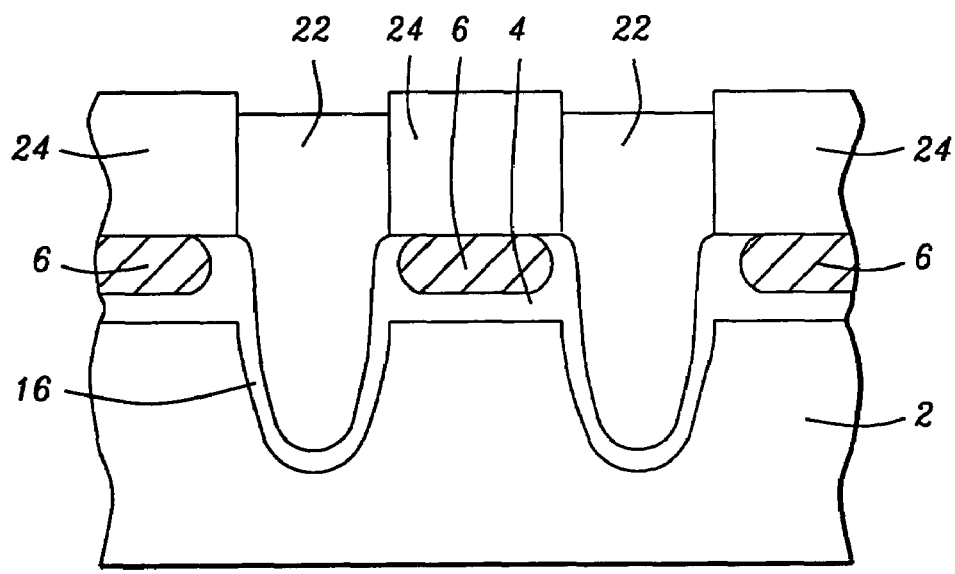
FIG. 3b - Prior Art

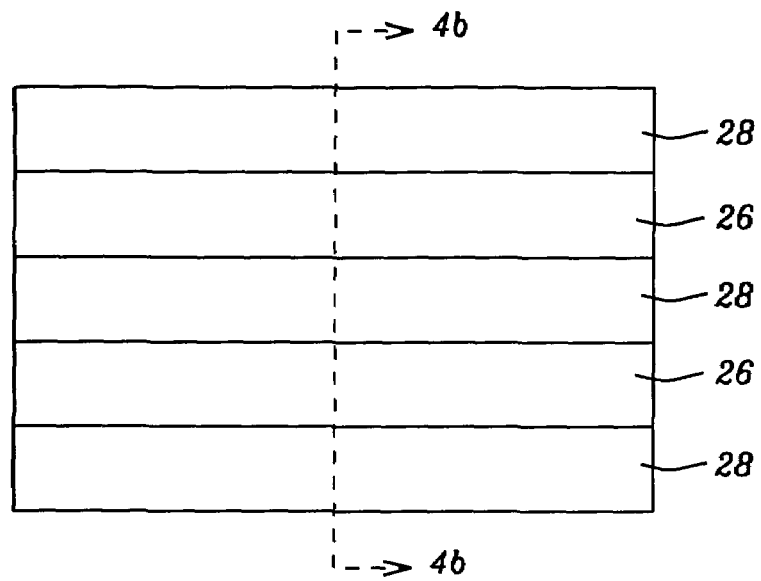
FIG. 4a – Prior Art
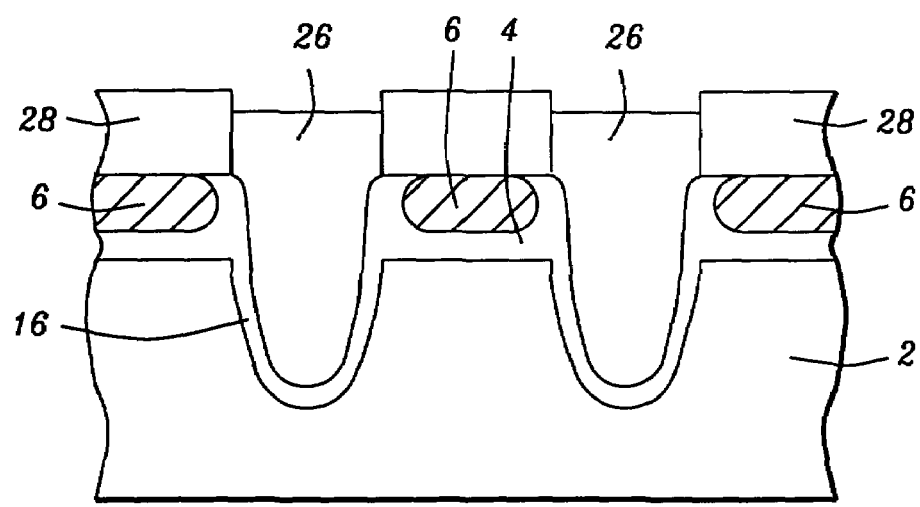
FIG. 4b – Prior Art

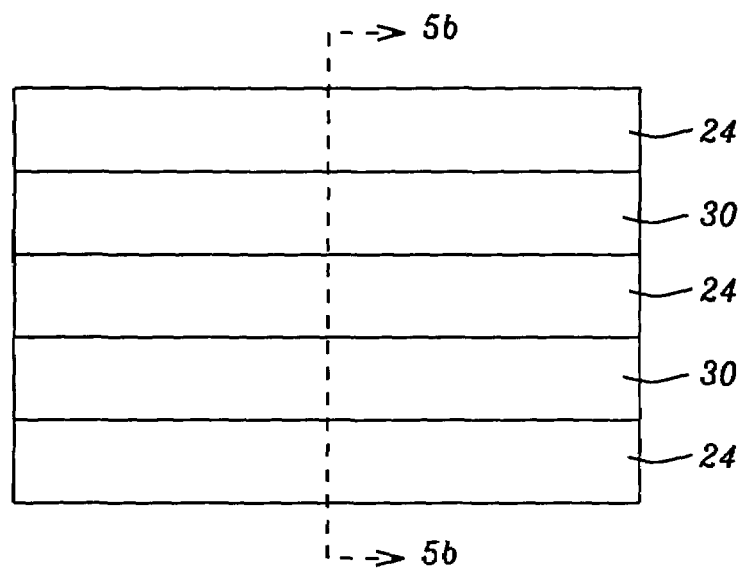
FIG. 5a — Prior Art
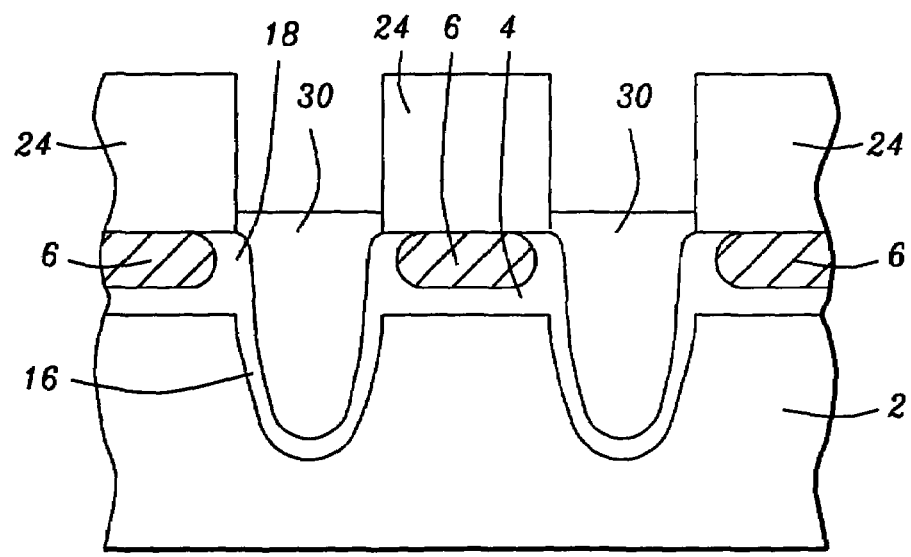
FIG. 5b — Prior Art

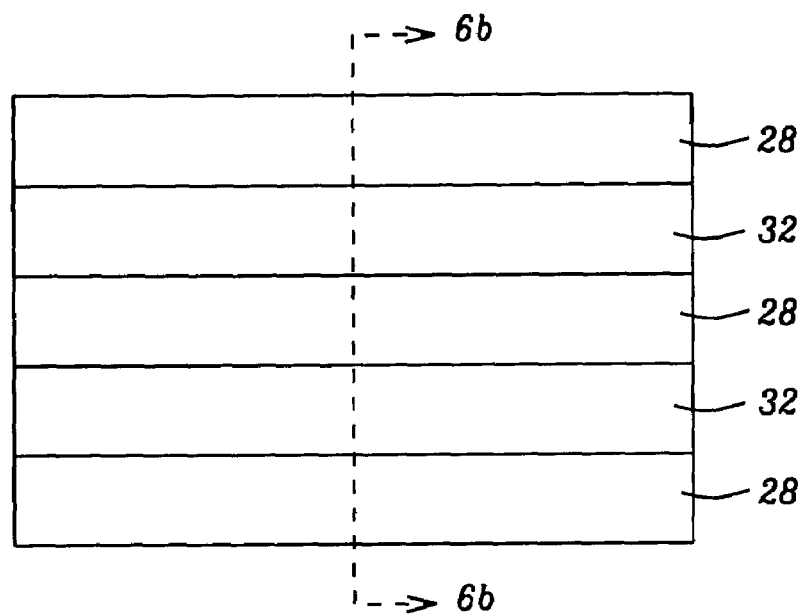
FIG. 6a – Prior Art
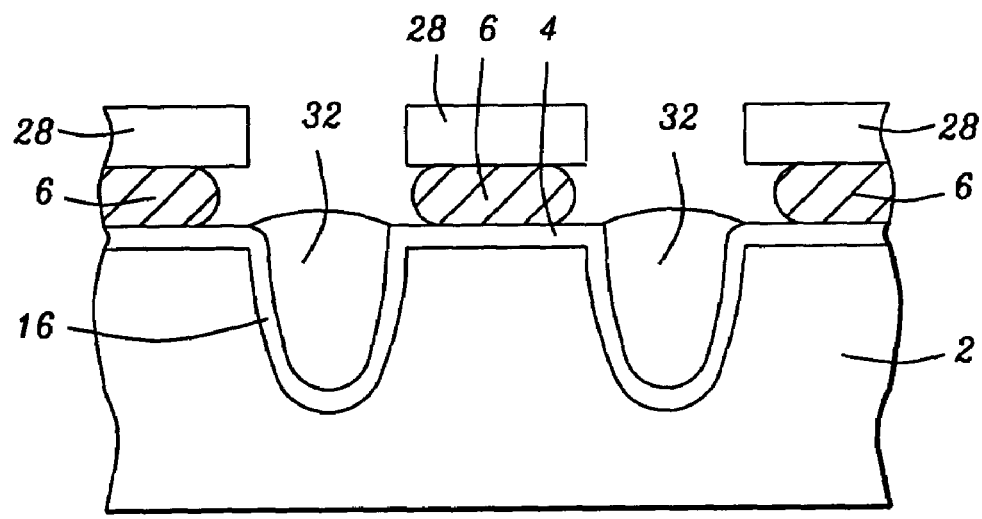
FIG. 6b – Prior Art

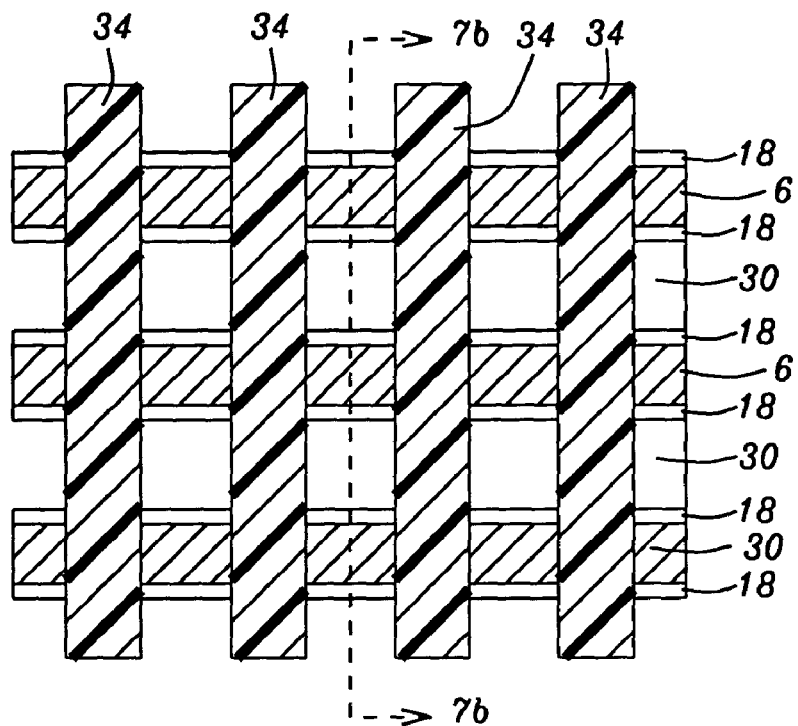
FIG. 7a – Prior Art
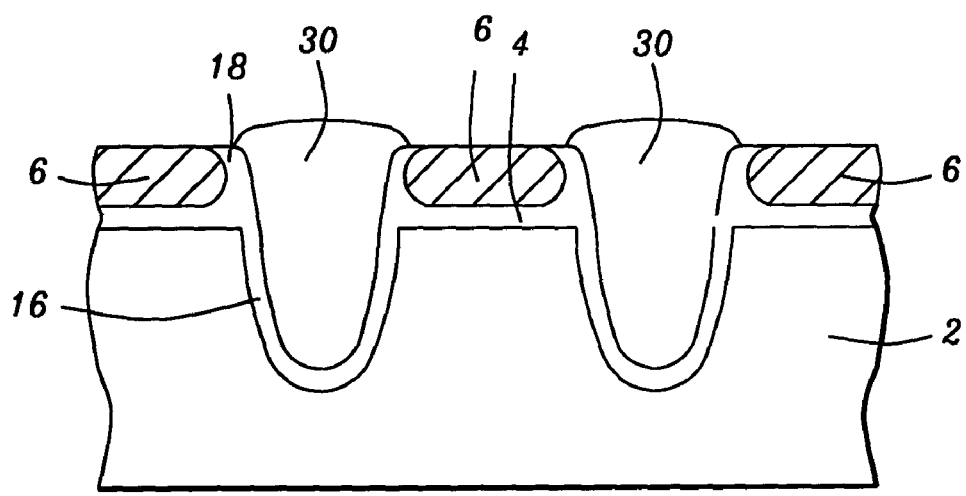
FIG. 7b – Prior Art

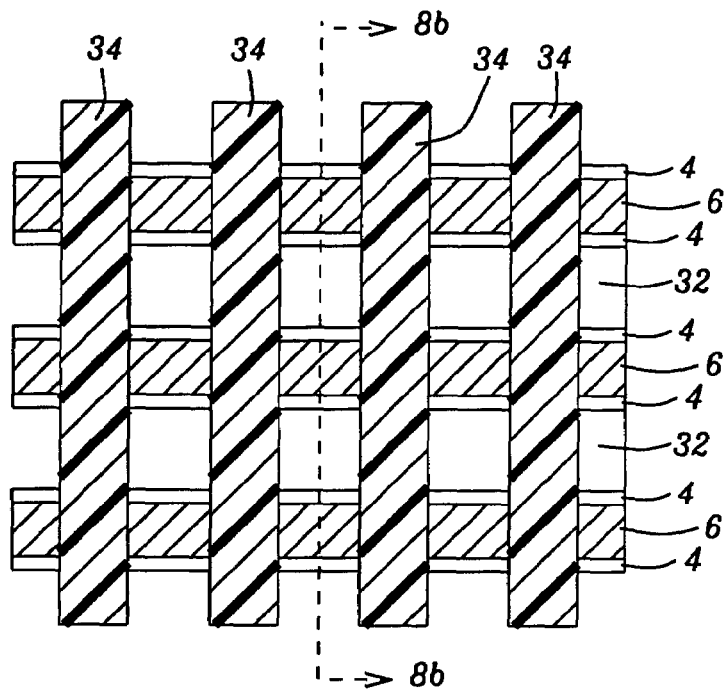
FIG. 8a – Prior Art
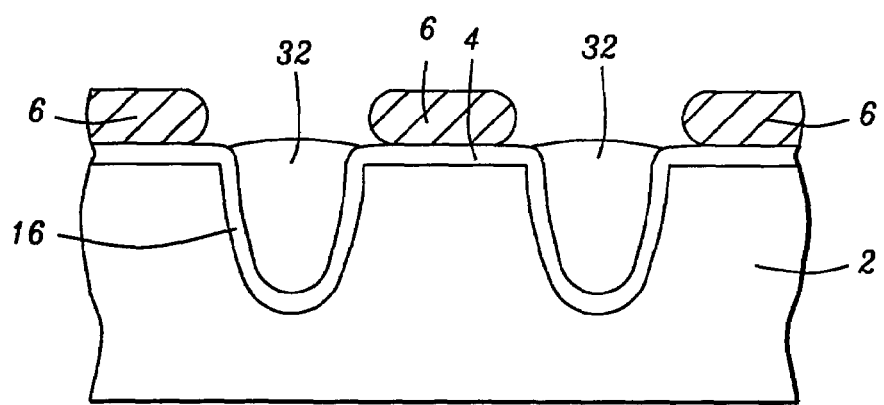
FIG. 8b – Prior Art

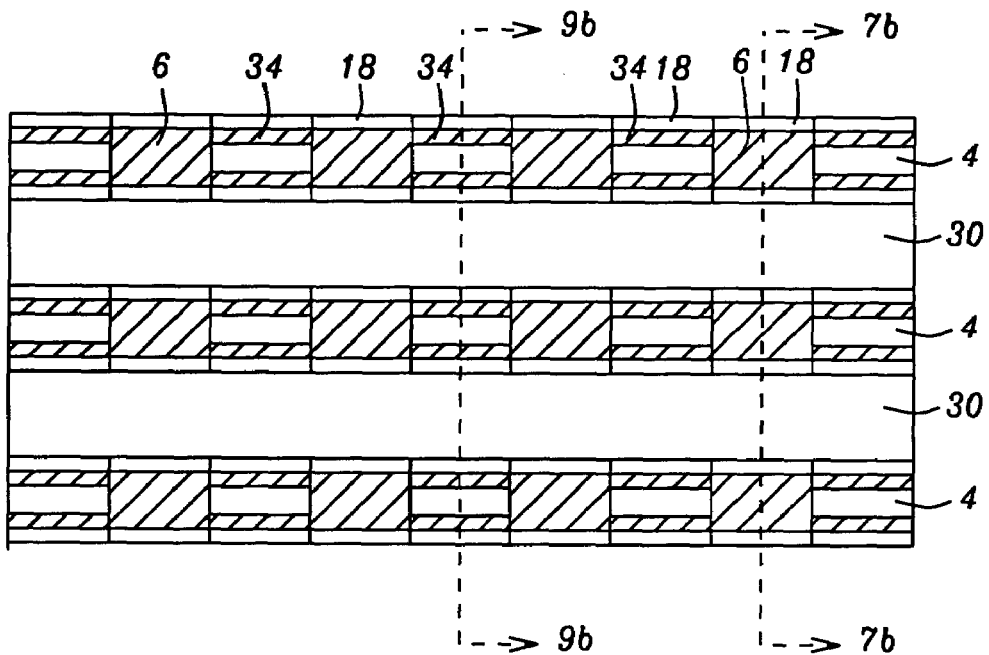
FIG. 9a – Prior Art
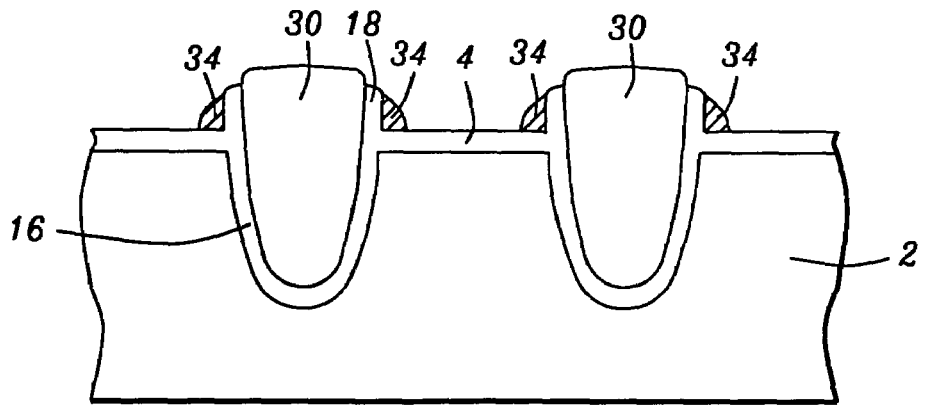
FIG. 9b – Prior Art

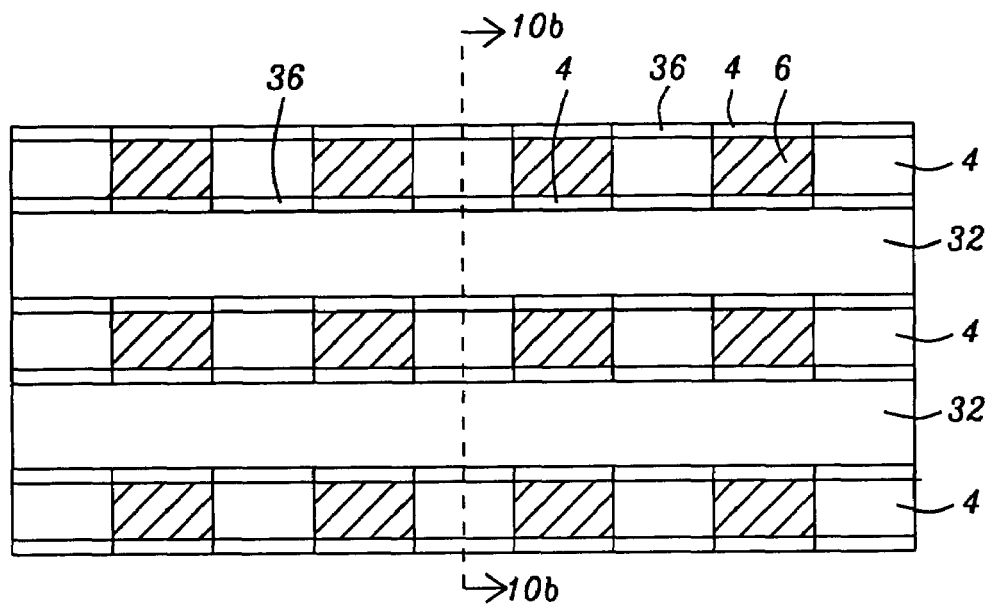
FIG. 10a — Prior Art
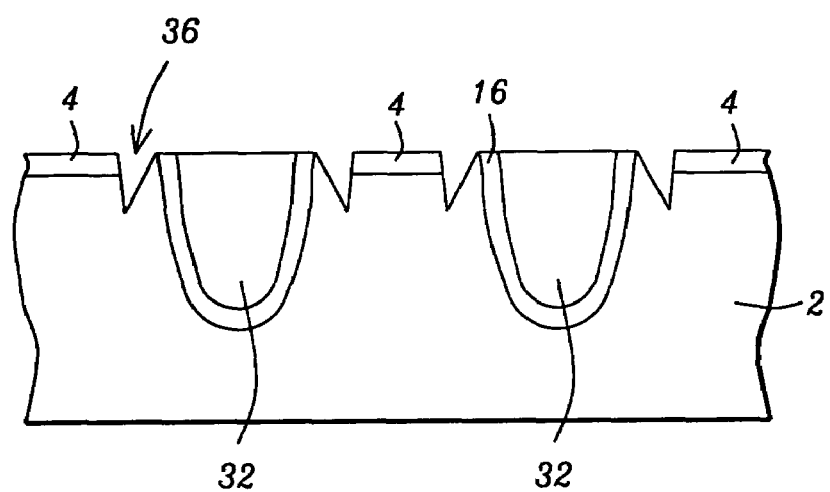
FIG. 10b — Prior Art

METHOD TO FORM SELF-ALIGNED FLOATING GATE TO DIFFUSION STRUCTURES IN FLASH

BACKGROUND OF THE INVENTION (1) Field of the Invention

The present invention relates generally to semiconductor integrated circuit technology and more particularly to memory cells used in flash EEPROMs (Electrically Erasable Programmable Read Only Memory).

(2) Description of Prior Art

Self-alignment of various components in a device can help reduce tolerances and improve the packing density of chips. In flash EEPROM memory cells self-alignment of the floating gates to diffusion is particularly important, and methods have been devised to provide this self-alignment. A major problem, which is eliminated by the invention, is that traditional methods of foiling self-aligned floating gate to diffusion structures inherently generate catastrophic defects. The efficiency of operations in flash memory cells is strongly dependent on the control gate to floating gate coupling ratio. In traditional methods of forming self-aligned floating gate to diffusion structures flash memory cells process related reductions of the coupling ratio occur. Such process related reductions in the coupling ratio do not occur in the method of the invention.

A conventional method for forming a traditional floating gate structure, in which the floating gate is self-aligned to the diffusion, is advantageously described with reference to FIGS. 1a–10b, of which FIGS. na, n=1-10, present top views and the rest show cross-sectional views. FIGS. 1a and 1b show the structure just before the etching steps to form isolation regions. To arrive at this stage, a gate oxide layer, 4, of thickness about 90 Angstroms is formed over the surface of a crystalline silicon region, 2, and a conductive polysilicon layer, 6, about 600 Angstroms thick and silicon nitride layer, 8, about 1600 Angstroms thick are successively formed over the oxide layer. Next a photoresist layer is formed and patterned into parallel stripes, 10. The direction of the stripes, 10, is denoted the horizontal direction and the direction perpendicular to the stripes is denoted the vertical direction. Successively etching the silicon nitride layer, the polysilicon layer, the oxide layer and the silicon region forms the shallow trench isolation (STI) regions 12, after which the photoresist layer 10 is removed and the structure is as shown in FIGS. 2a and 2b. The STI regions define the active regions, 14, upon which they border and also, simultaneously, define the horizontal borders of the polysilicon layer that overlie the active regions and that will constitute the floating gates, providing the self-alignment of the floating gates to the diffusion, i.e. the silicon region of the active regions. Next, the STI are filled with oxide. First a silicon oxide liner layer, 16, about 200 Angstroms thick is grown over the sides and bottom of the STI. Since the oxidation rate of polysilicon is larger than of crystalline silicon, an even thicker silicon oxide layer, 18, is grown, at the same time, over the exposed surfaces of the polysilicon layer. As a result of the liner oxidation step the polysilicon sides, 20, are rounded and do no longer entirely cover the silicon region of the active regions. This results in a reduction in the control gate to floating gate coupling ratio and thus to a decrease in the efficiency of device operation. Furthermore, the polysilicon no longer protects the silicon region corner, which consequently can be damaged in the polysilicon etching process that follows. Next an HDP oxide is deposited to a depth of about 6500 Angstroms filling the STI. A CMP process is then performed that; since the oxide CMP cannot be precisely controlled, can at times lead to the undesirable situations shown in FIGS. 3a, 3b, 4a and 4b. The situation shown in FIG. 3b, referred to as the excess case, occurs when insufficient material is removed in the CMP process. Thus, the thickness of the HDP oxide layer, 22, and of the silicon nitride layer, 24, are significantly larger than nominal. In FIG. 4b, the situation shown, referred to as the deficiency case, occurs when too much material is removed in the CMP process. In this case the thickness of the HDP oxide layer, 26, and of the silicon nitride layer, 28, are significantly smaller than nominal. An oxide dip etch step is performed next in which the thickness of the oxide layers are reduced, to achieve the structures shown in FIGS. 5a and 5b for the excess case and FIGS. 6a and 6b for the deficiency case. In the excess case the HDP oxide, 30, extends above the level of the polysilicon layer, which is therefore not exposed. The HDP oxide, 32, in the deficiency case just covers the STI region and as a consequence the oxide grown on the sides of the polysilicon layer, 20, is also removed by the oxide dip etch. After removing the silicon nitride layer, a photoresist layer, 34, is patterned into stripes in the vertical direction to further define the floating gates. Before a polysilicon etching step the cross sections in regions between the photoresist stripes, regions where polysilicon will be removed, is as shown in FIGS. 7a and 7b for the excess case and FIGS. 8a and 8b for the deficiency case. In each case significant defects arise as indicated in FIGS. 9a and 9b for the excess case and 10a and 10b for the deficiency, which show the corresponding cross-sections after the polysilicon etch. Polysilicon residues, 34, are found, in the excess case, adjacent to the oxide grown on the polysilicon sides where the residues were protected from the silicon etch. The defect in the deficient case, 36, is damage to the silicon region where there was no polysilicon layer or polysilicon oxide layer during the polysilicon etch. Both defects are essentially catastrophic to the device and it is a primary objective of the invention to provide a method of forming self-aligned floating gate to diffusion structures in which these defects are not generated. It is a further primary objective of the invention to provide a method of forming self-aligned floating gate to diffusion strictures in which process related reductions in the floating gate to control gate coupling ratio do not occur.

Chu et al. U.S. Pat. No. 6,403,494 discloses a method of forming a split-gate flash memory cell with the floating gate self-aligned to the shallow trench isolation (STI). The self-alignment is made possible, in one embodiment, by the use of an anti-reflective coating and, in another embodiment, by the use of a low-viscosity material. Lin et al. U.S. Pat. No. 6,358,796 teaches a method to fabricate a split-gate flash memory cell with self-aligned STI without the intrusion of a smiling gap. U.S. Pat. No. 6,245,685 to Sung et al. shows a method for forming a square oxide stricture or a square floating gate stricture without rounding of corners. U.S. Pat. No. 6,140,182 to Bergemont discloses a method for reducing the spacing between adjacent floating gates of flash memory arrays. Camerlenghi, U.S. Pat. No. 5,330,938, shows a method of making s non-volatile split-gate EEPROM cell with self aligned field insulation.

SUMMARY OF THE INVENTION

It is a primary objective of the invention to provide a method of forming self-aligned floating gate to diffusion structures in which defects inherent to the process are not generated. It is a further primary objective of the invention to provide a method of forming self-aligned floating gate to diffusion structures in which process related reductions in the floating gate to control gate coupling ratio do not occur. Reductions in the coupling ratio are caused by the oxidation and rounding of the polysilicon layer, from which the floating gates are to be made, during the STI liner oxidation. Oxidation of the polysilicon layer is also a cause of the defects generated by the traditional process. When an excess of material is removed in a CMP step, a subsequent oxide dip etch removes the oxide grown on the polysilicon layer so that a polysilicon etch that follows attacks the underlying silicon region. In the case of a deficiency of material removed in the CMP step, the polysilicon oxide is not removed in the oxide dip etch. This remaining polysilicon oxide impedes removal of adjacent polysilicon in the polysilicon etch and a polysilicon residue remains. Neither these defects nor the reductions in the coupling ratio occur in the process of the invention.

Horizontal dimensions of the conductive regions are established and their sidewalls protected by insulator spacers before forming the trenches of the STI regions. Consequently, the conductive regions are not oxidized during trench liner oxidation and the trench liner oxidation causes the semiconductor region-liner oxide boundary to be established under the conductive region. There is no rounding of the floating gates and thus no reduction in the coupling ratio. Furthermore, conductive region residue and semiconductor region damage do not occur and these defects could occur if insulator spacers are not formed to provide protection.

A self-aligned conductive region to active region structure is disclosed in which parallel active regions of a semiconductor region of a substrate, which extends to a surface, are separated by STI regions. The STI regions have an insulator liner layer grown over their sides and are filled with an insulator filler layer. Equally spaced gate insulator regions, formed prior to the STI regions, are disposed over the active regions and overlap a portion of the insulator liner layer. Conductive regions, formed prior to the STI regions, are disposed over the gate insulator regions.

BRIEF DESCRIPTION OF THE DRAWINGS

In the accompanying drawing forming a material part of this description, there is shown:

FIGS. 1a–10b show a method for forming a traditional floating gate structure, in which the floating gate is self-aligned to the diffusion.

DESCRIPTION OF THE PREFERRED EMBODIMENTS

Preferred embodiments of the invention are well described with the aid of FIGS. 7a–16b. Methods for forming a floating gate structure in which the floating gate is self-aligned to the diffusion according to preferred embodiments of the invention are advantageously described with reference to FIGS. 11a–20b, of which FIGS. na, n=11–20 present top views and FIGS. nb, n=11–20 show cross-sectional views. FIGS. 11a and 11b show the structure just before the etching steps to form isolation regions. To arrive at this stage, a gate insulator layer, 38, which preferably is a grown gate oxide layer of thickness about 90 Angstroms, is formed over the surface of a semiconductor region, 40, which preferably is a crystalline silicon region.

Figure 11A:
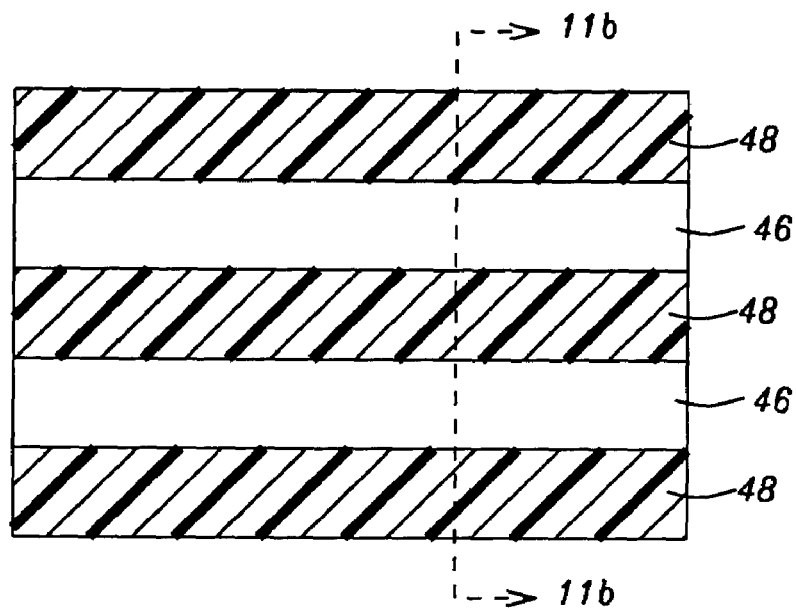
FIGS. 11a–20b show a method for forming a floating gate structure in which the floating gate is self-aligned to the diffusion, according of the invention.
Figure 11B:
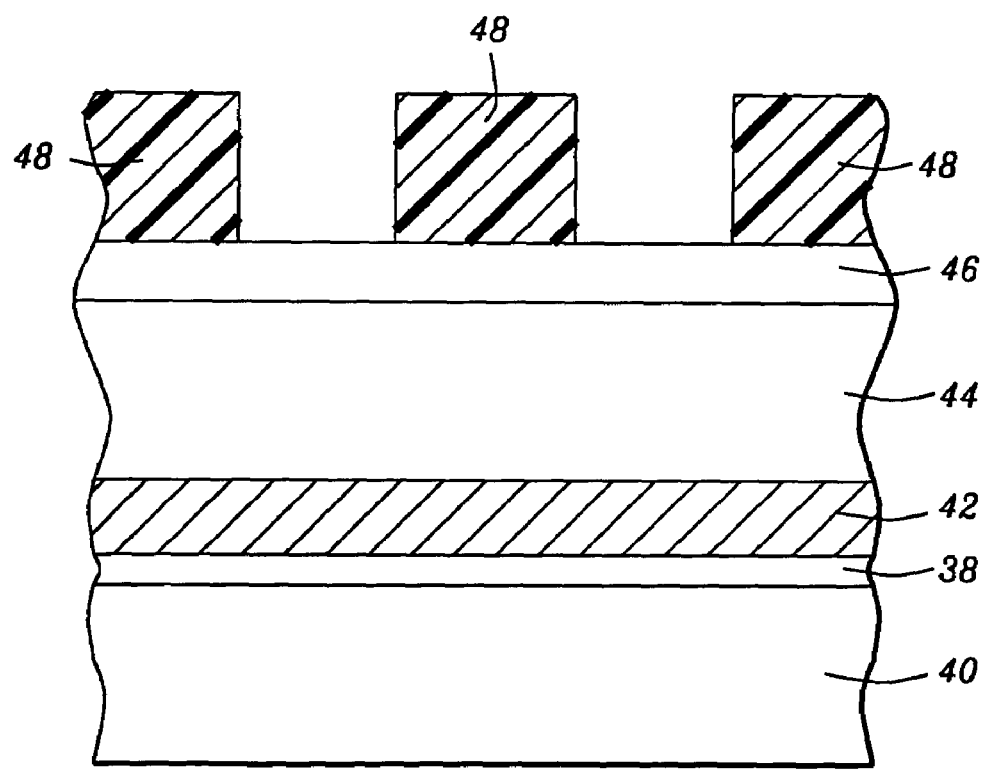
Figure 12A:
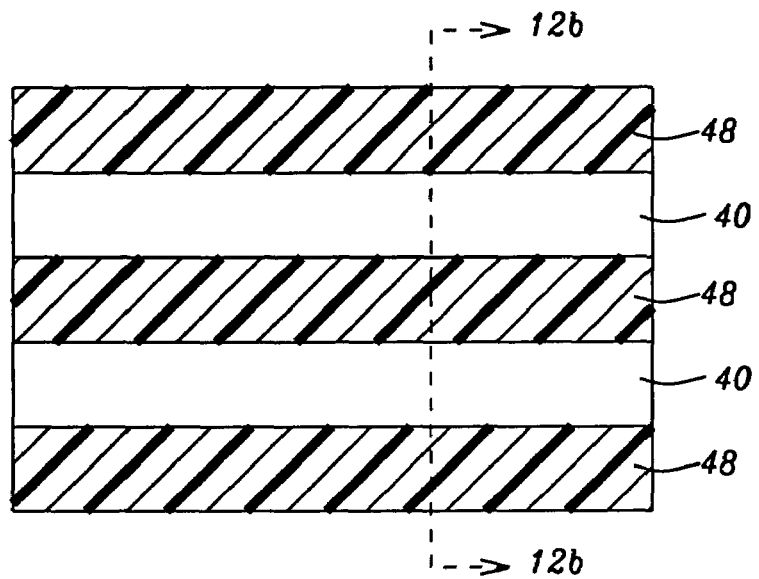
Figure 12B:
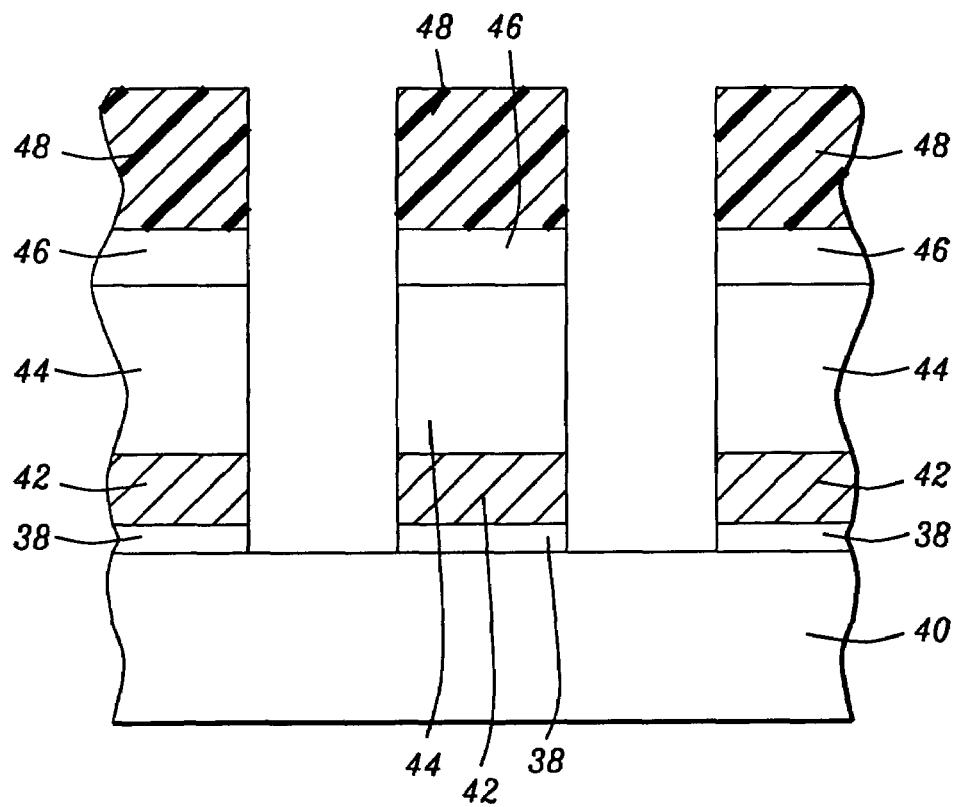
Figure 13A:
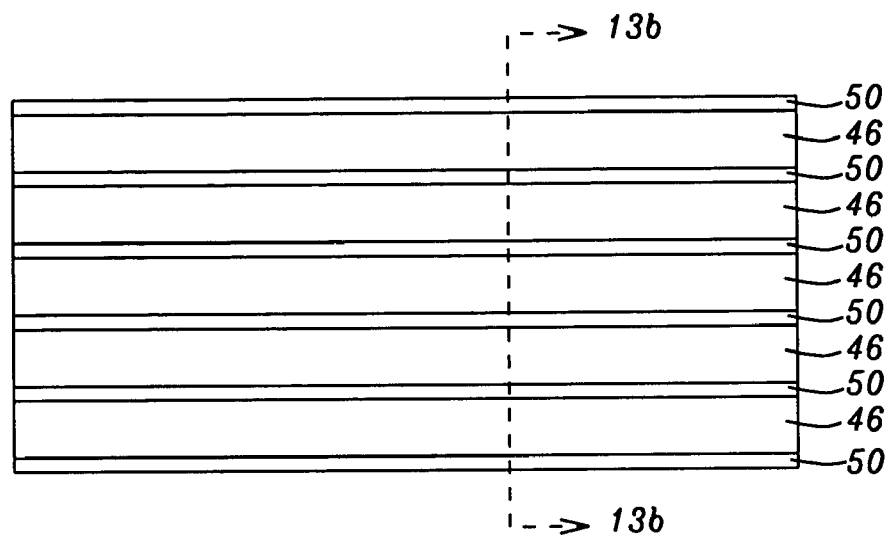
Figure 13B:
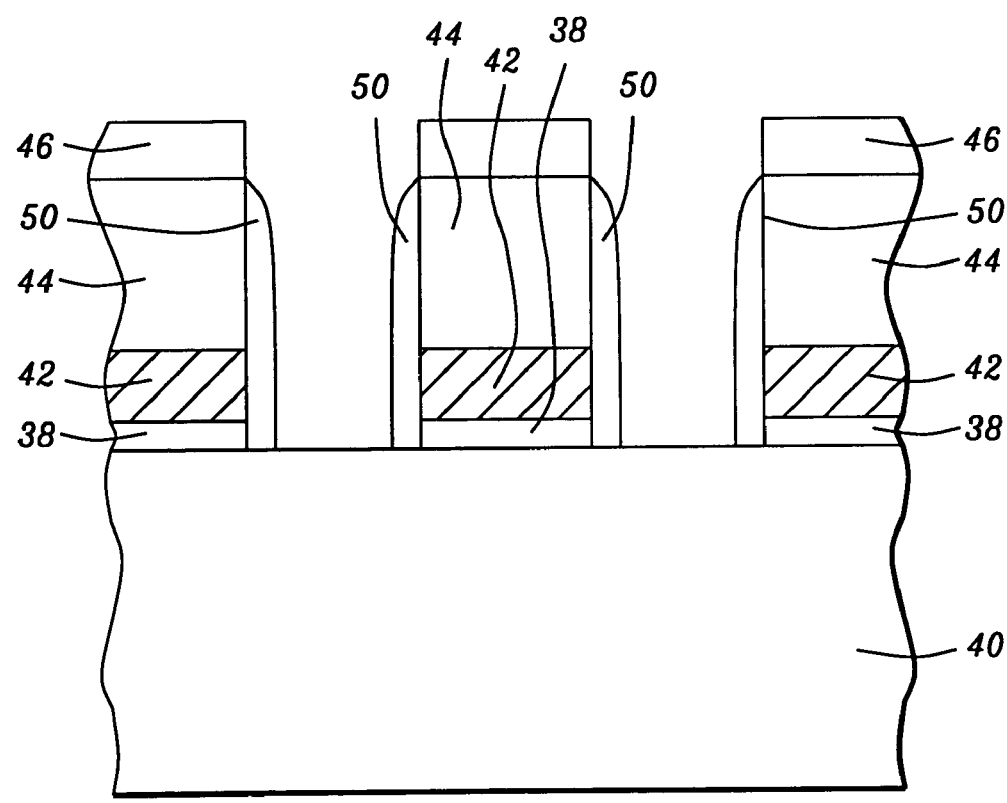
Figure 14A:
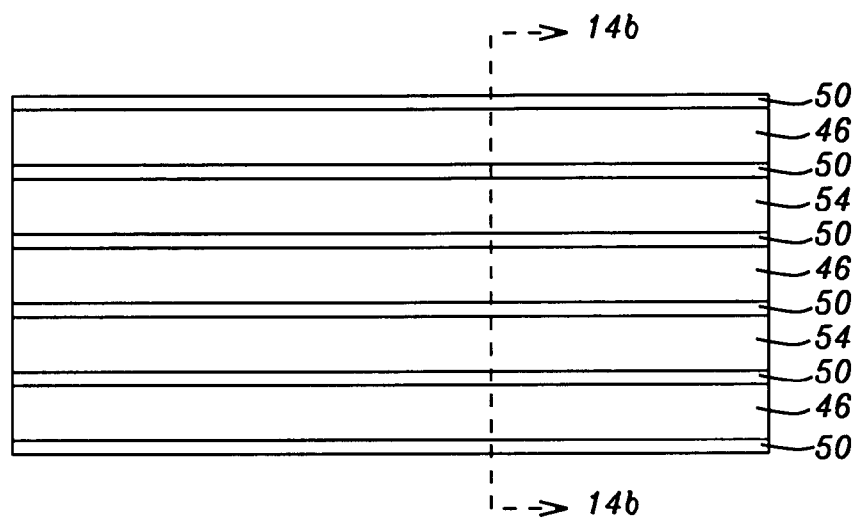
Figure 14B:
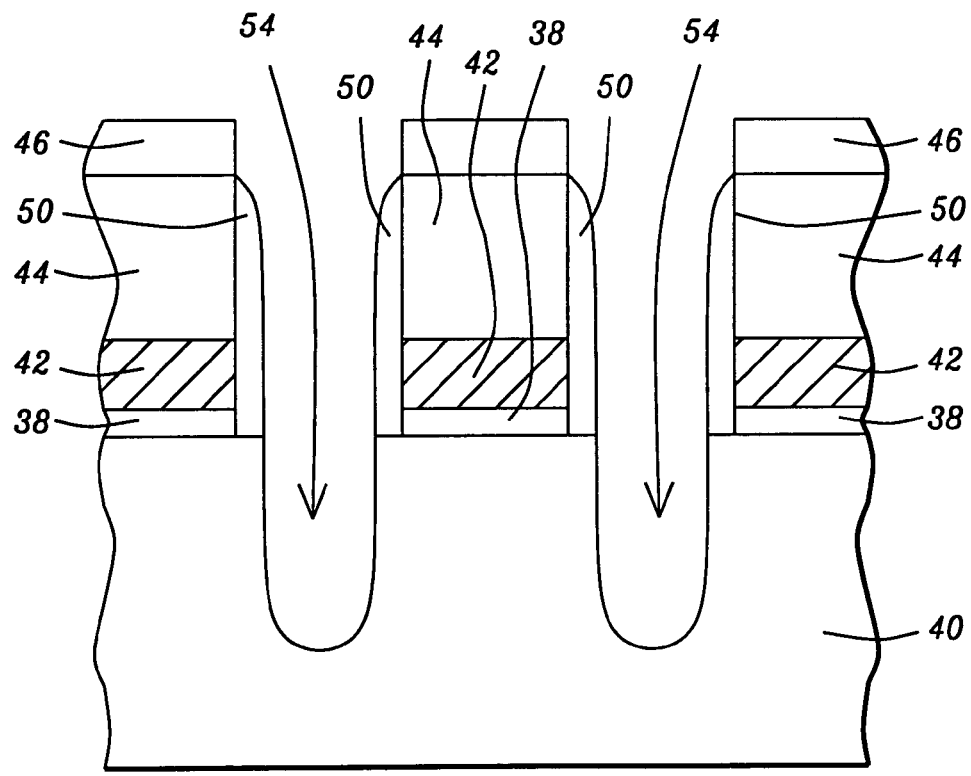
Figure 15A:
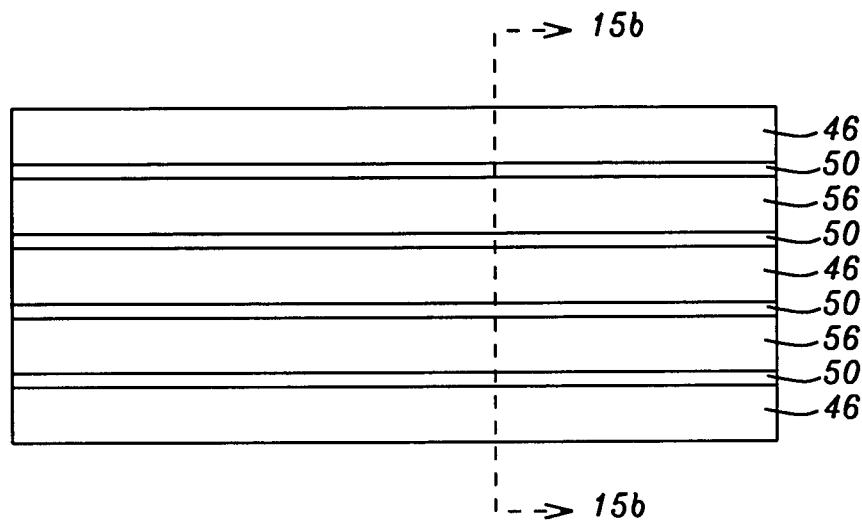
Figure 15B:
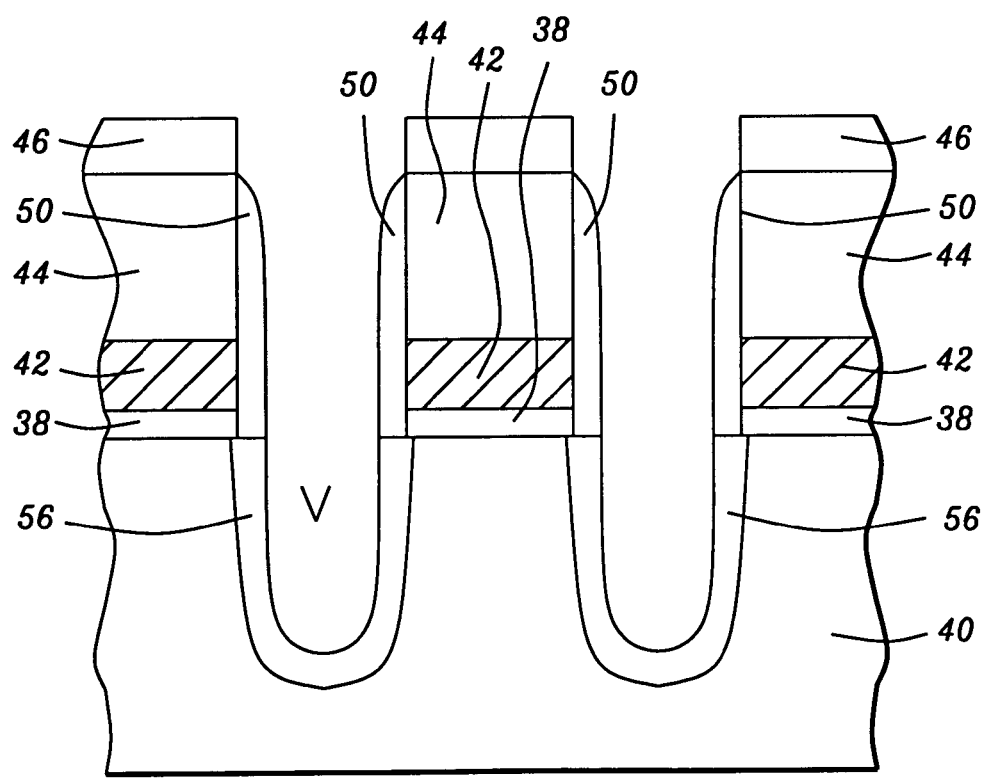
Figure 16A:
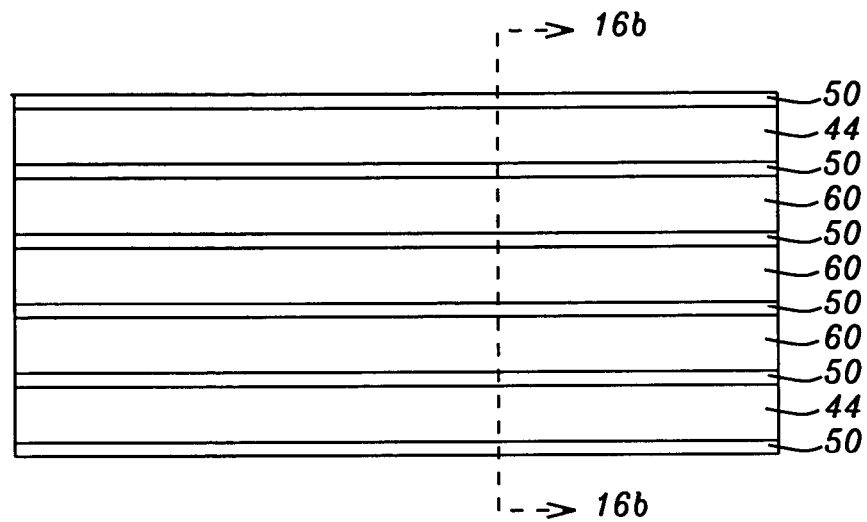
Figure 16B:
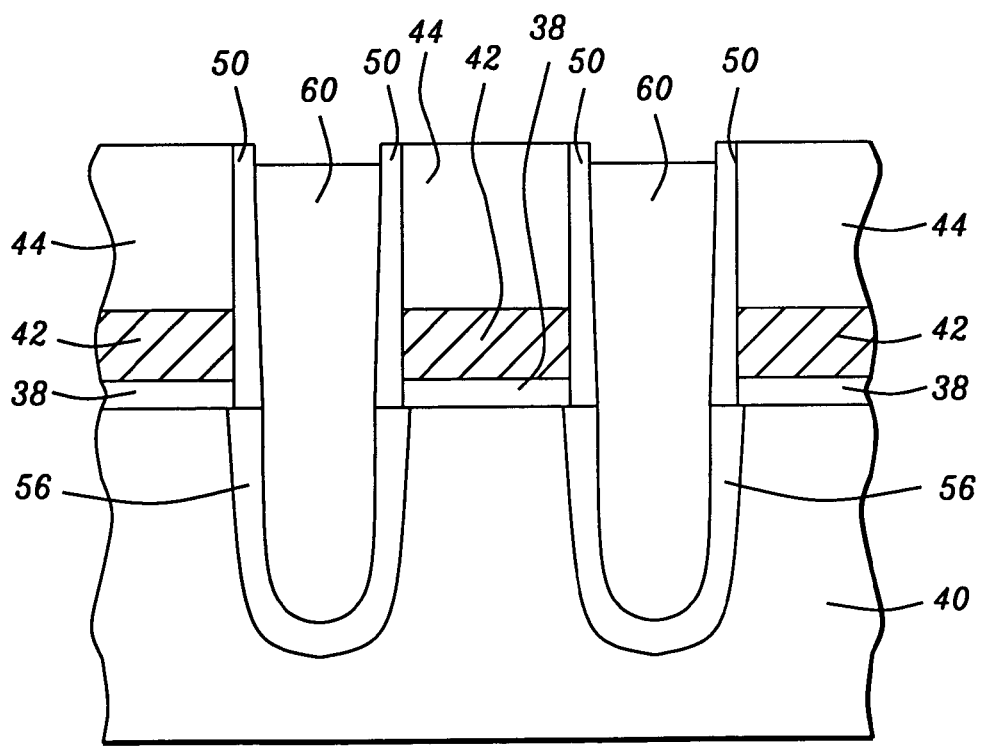
Figure 17A:
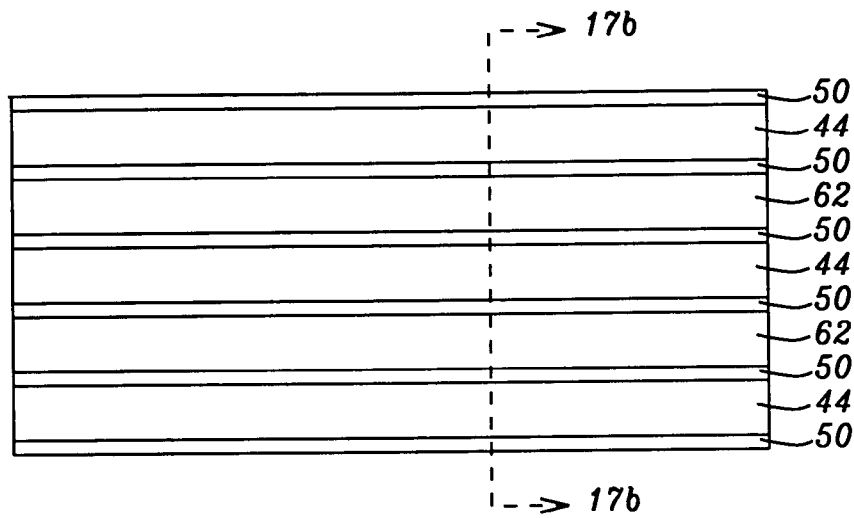
Figure 17B:
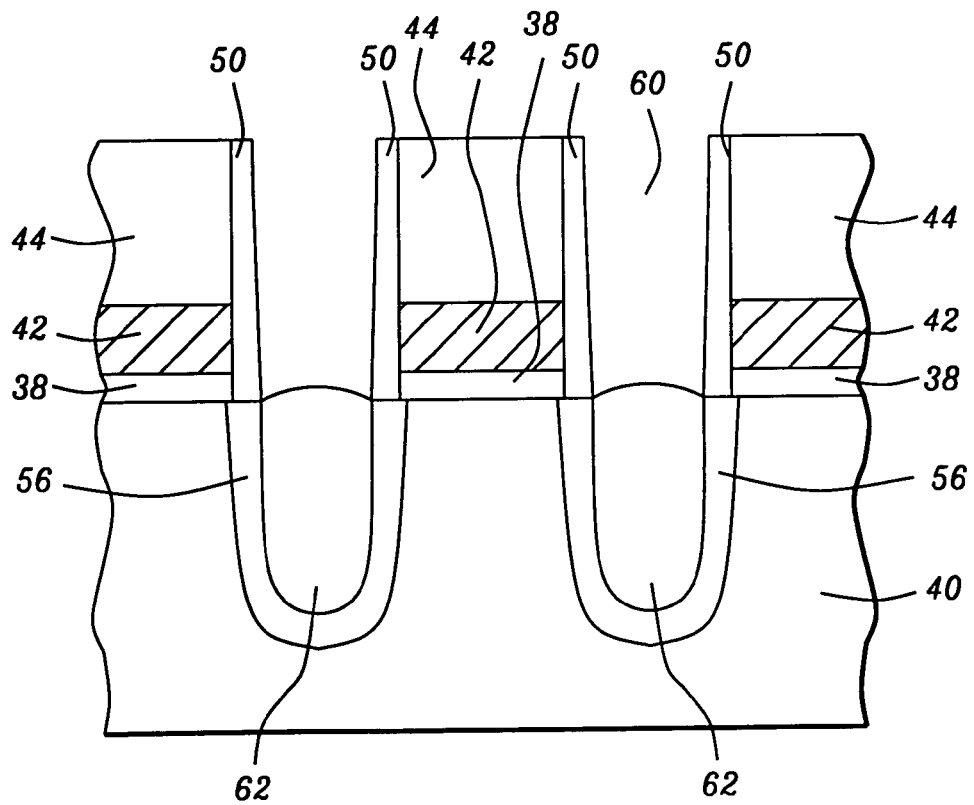
Figure 18A:
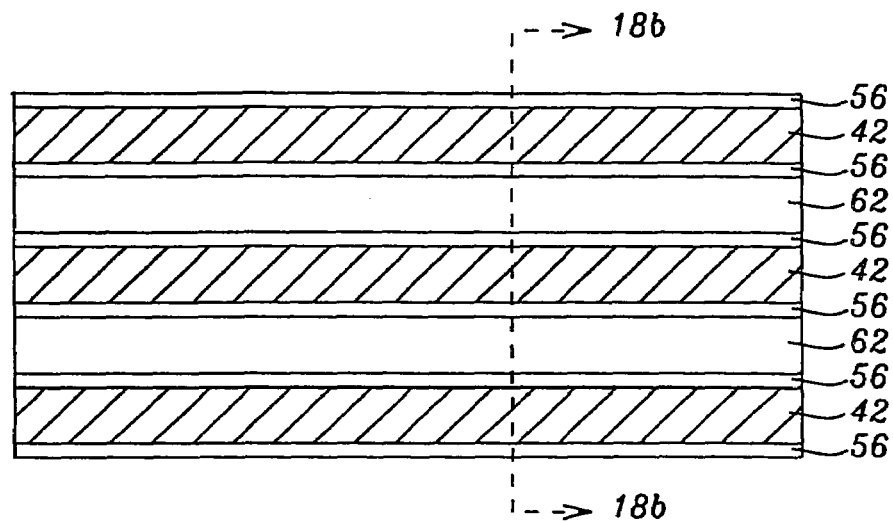
Figure 18B:
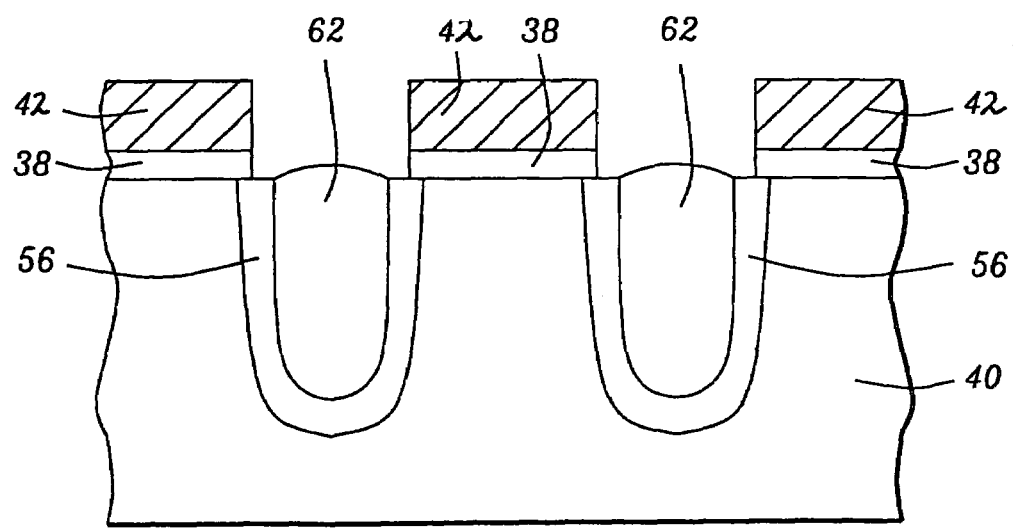
Figure 19A:
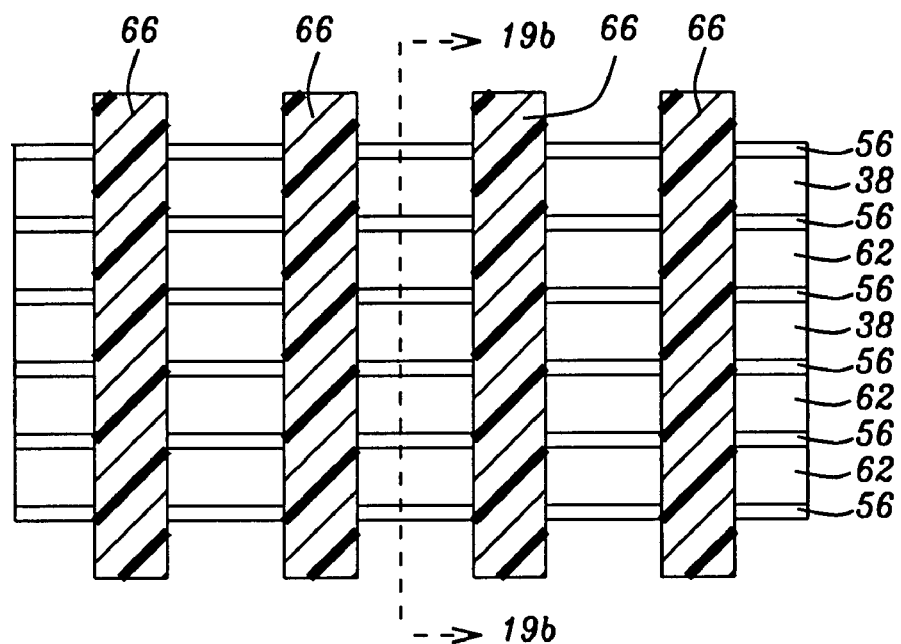
Figure 19B:
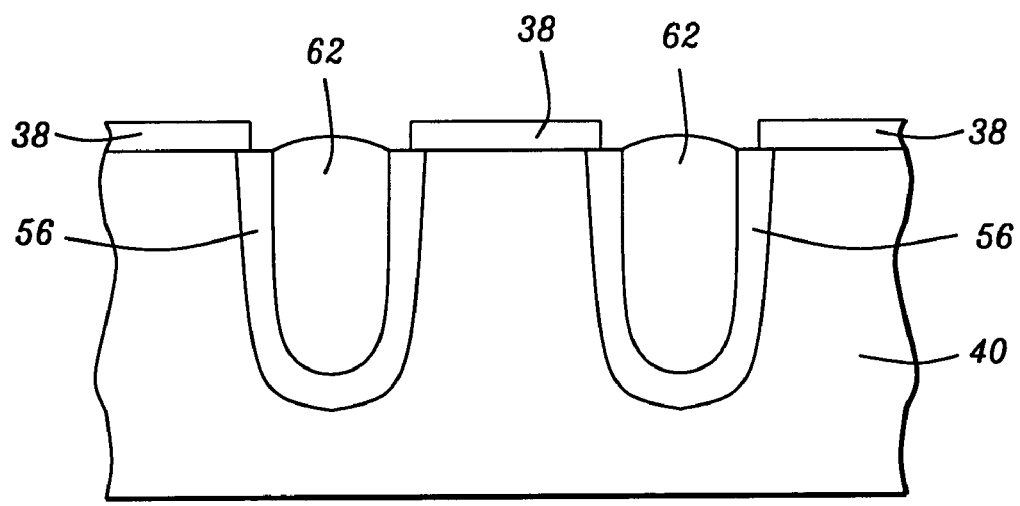
Figure 20A:
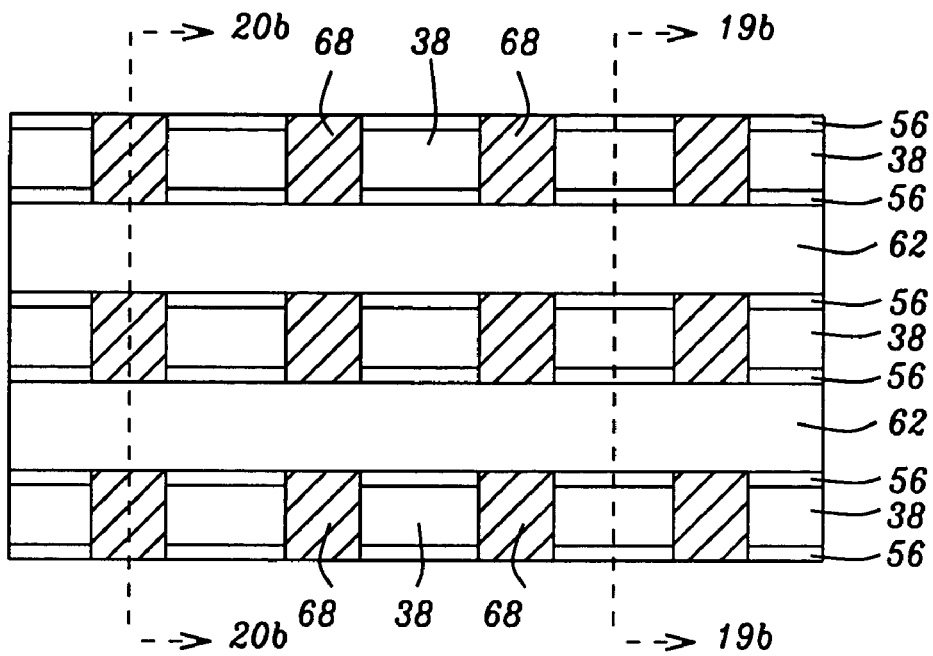
Figure 20B:
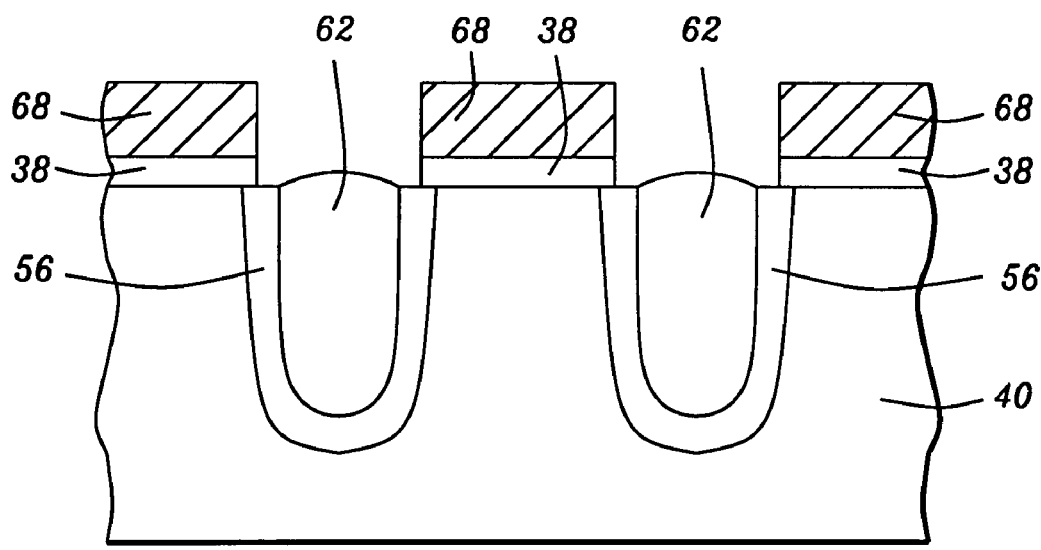

A conductive layer, 42, which is preferably a conductive polysilicon layer about 600 Angstroms thick, and an insulator layer, 44, which is preferably a silicon nitride layer about 1600 Angstroms thick, are successively formed over the gate insulator layer. In most preferred embodiments of the invention a hard mask layer, 46, which preferably is an oxide layer deposited to a thickness of about 500 Angstroms, is deposited over the insulator layer. Preferred embodiments of the invention could not have this layer, whose purpose is to protect the underlying insulator layer, 44, during the etching of the semiconductor region, 40, in forming the STI trenches. In case the hard mask layer is not used, an etchant with high selectivity for semiconductor 40 to insulator 44 is required for etching the trenches. Next the hard mask layer, the insulator layer, the conductive layer and the gate insulator layer are patterned into parallel stripes whose direction is denoted the horizontal direction and the direction perpendicular to the stripes is denoted the vertical direction. Forming a photoresist layer and patterning the photoresist layer into parallel stripes, 48, and successively etching the hard mask layer, the insulator layer, the conductive layer and the gate insulator layer preferably accomplishes this patterning. At this stage, before the photoresist stripes are removed, the structure is as depicted in FIGS. 12a and 12b. The process step that follows the patterning, which is after removal of the photoresist stripes in most preferred embodiments of the invention, is crucial since it enables fabrication of a self-aligned floating gate to diffusion structure without the deleterious affects found in traditional methods. A spacer insulator layer is deposited, which in preferred embodiments of the invention could be about 200 Angstroms of nitride. An etching step follows producing the sidewall spacers 50, which protect the polysilicon sidewalls, 52, from being oxidized during liner oxidation. Next the semiconductor region is etched to produce the shallow trench isolation (STI) regions, 54. It is now safe to form the trench liner layer, 56, which in most preferred embodiments is an oxide layer grown to a thickness of about 250 Angstroms. The thickness of the trench liner layer determines the width of the active regions, which is the width of the semiconductor region, at its surface, between the STI regions and the thicker the trench liner layer, the narrower the active region. Since the sidewall spacers, 50, protect the conductive layer, 42, the conductive layer is not oxidized and it therefore extends beyond the active region. Protection is thus provided to the active region and the defects generated in traditional methods; i.e., conductive layer residue and semiconductor region damage; consequently do not occur in the methods of the invention. Because the conductive layer is not oxidized there is no rounding of the conductive layer and therefore there is no process related impact on the coupling ratio. After depositing an insulator filler layer, which preferably is an HDP oxide layer about 6500 Angstroms thick, a planarization step, which in preferred embodiments of the invention is a CMP step, is performed to achieve the structure shown in FIGS. 16a and 16b, where region 60 is the filled STI region after CMP. An etching step is now performed, which preferably is an oxide dip etch step, to achieve the structures shown in FIGS. 17a and 17b. Removing the insulator layer, 44, and the sidewall spacer layer, 50, gives rise to the structure depicted in FIGS. 18a and 18b. Edges of the semiconductor region, are in the methods of the invention completely covered by the conductive layer, 42, providing protection so that the conductive layer residue and semiconductor region damage consequently do not occur. It remains to complete the formation of the floating gates, which requires an additional patterning of the conductive layer. Preferably, this patterning is accomplished as indicated in FIGS. 19*a* and 19*b*. A photoresist layer is formed and patterned into vertical stripes, 66. Etching the conductive layer and removing the photoresist completes the formation of floating gates, 68, as shown in FIGS. 20*a* and 20*b*, which are self-aligned to diffusion according to preferred embodiments of the invention.

Preferred embodiments of the invention have been described above with reference to floating gates, such as those used in EEPROM flash memory cells. However the invention is applicable to any kind of conductive region, such as FET gates, that border on STI regions, providing methods of forming self aligned conductive region to active region structures that are immune to residue and active region damage defects. As described in detail above, the horizontal dimensions of the conductive regions are established and their sidewalls protected by insulator spacers before forming the trenches of the STI regions. Consequently, the conductive regions are not oxidized during trench liner oxidation and the trench liner oxidation causes the semiconductor region-liner oxide boundary to be established under the conductive region. As result, conductive region residue and semiconductor region damage do not occur and these defects could occur if insulator spacers are not formed to provide protection.

While the invention has been particularly shown and described with reference to the preferred embodiments thereof, it will be understood by those skilled in the art that various changes in form and detail may be made without departing from the spirit and scope of the invention.

What is claimed is:

1. A method of fabricating a self-aligned conductive region to active region structure comprising:
   providing a semiconductor region within a substrate extending to a surface, forming a gate insulator layer over said semiconductor region;
   forming, sequentially, a conductive layer, an insulator layer and a hard mask layer over said gate insulator layer,
   patterning said gate insulator layer, said conductive layer, said insulator layer and said hard mask layer to form a plurality of tiered parallel stripes;
   forming a spacer insulator layer over the sidewalls of said parallel stripes;
   forming trenches in said semiconductor region between said parallel stripes;
   growing an insulator liner layer over sides of said trenches and underlying said spacer insulator, and depositing an insulator filler layer so that said trenches and the space between said parallel stripes are filled with said insulator filler layer,
   planarizing so that said insulator filler layer above top of said insulator layer is removed and said hard mask is removed;
   etching said filler layer so that it just fills said trenches;
   removing said insulator layer and said insulator spacer layer;
   patterning said conductive layer to form separated conductive regions.

2. The method of claim 1 wherein said semiconductor region is a silicon region.

3. The method of claim 1 wherein said substrate is a silicon substrate.

4. The method of claim 1 wherein said gate, insulator regions are oxide regions.

5. The method of claim 1 wherein said insulator liner layer is a grown oxide layer.

6. The method of claim 1 wherein said insulator filler layer is an HDP oxide layer.

7. The method of claim 1 wherein said conductive layer is composed of doped polysilicon.

8. The method of claim 1 wherein said insulator layer is a nitride layer.

9. The method of claim 1 wherein said hard mask layer is an oxide layer.

10. The method of claim 1 wherein said insulator spacer layer is a nitride layer.

11. The method of claim 1 wherein said planarizing is performed using CMP.

12. The method of claim 1 wherein said conductive regions are gates of semiconductor integrated circuit devices.

13. The method of claim 1 wherein said spacer insulator layer is on said insulator liner layer.

14. A method of fabricating a self-aligned floating gate to active region structure comprising:
    providing a semiconductor region within a substrate extending to a surface,
    forming a gate insulator layer over said semiconductor region;
    forming, sequentially, a conductive layer, an insulator layer and a hard mask layer over said gate insulator layer;
    patterning said gate insulator layer, said conductive layer, said insulator layer and said hard mask layer to form a plurality of tiered parallel stripes;
    forming a spacer insulator layer over the sidewalls of said parallel stripes;
    forming trenches in said semiconductor region between said parallel stripes;
    growing an insulator liner layer over sides of said trenches and underlying said spacer insulator, and depositing an insulator filler layer so that said trenches and the space between said parallel stripes are filled with said insulator filler layer;
    planarizing so that said insulator filler layer above top of said insulator layer is removed and said hard mask is removed;
    etching said filler layer so that it just fills said trenches;
    removing said insulator layer and said insulator spacer layer;
    patterning said conductive layer to form separated floating gates.

15. The method of claim 14 wherein said semiconductor region is a silicon region.

16. The method of claim 14 wherein said substrate is a silicon substrate.

17. The method of claim 14 wherein said gate insulator regions are oxide regions.

18. The method of claim 14 wherein said insulator liner layer is a grown oxide layer.

19. The method of claim 14 wherein said insulator filler layer is an HDP oxide layer.

20. The method of claim 14 wherein said conductive layer is composed of doped polysilicon.

21. The method of claim 14 wherein said insulator layer is a nitride layer.

22. The method of claim 14 wherein said hard mask layer is, an oxide layer.

23. The method of claim 14 wherein said insulator spacer layer is a nitride layer.

24. The method of claim 14 wherein said planarizing is performed using CMP.

25. The method of claim 14 wherein said spacer insulator layer is on said insulator liner layer.

26. A method of fabricating a self-aligned conductive region to active region structure comprising:
   providing a semiconductor region within a substrate extending to a surface,
   forming a gate insulator layer over said semiconductor region;
   forming, sequentially, a conductive layer and an insulator layer over said gate insulator layer;
   patterning said gate insulator layer, said conductive layer and said insulator layer to form a plurality of tiered parallel stripes;
   forming a spacer insulator layer over the sidewalls of said parallel stripes;
   forming trenches in said semiconductor region between said parallel stripes;
   growing an insulator liner layer over sides of said trenches and underlying said spacer insulator, and depositing an insulator filler layer so that said trenches and the space between said parallel stripes are filled with said insulator filler layer;
   planarizing so that said insulator filler layer above top of said insulator layer is removed;
   etching said filler layer so that it just fills said trenches;
   removing said insulator layer and said insulator spacer layer;
   patterning said conductive layer to form separated conductive regions.

27. The method of claim 26 wherein said semiconductor region is a silicon region.

28. The method of claim 26 wherein said substrate is a silicon substrate.

29. The method of claim 26 wherein said gate insulator regions are oxide regions.

30. The method of claim 26 wherein said insulator liner layer is a grown oxide layer.

31. The method of claim 26 wherein said insulator filler layer is an HDP oxide layer.

32. The method of claim 26 wherein said conductive layer is composed of doped polysilicon.

33. The method of claim 26 wherein said insulator layer is a nitride layer.

34. The method of claim 26 wherein said insulator spacer layer is a nitride layer.

35. The method of claim 26 wherein said planarizing is performed using CMP.

36. The method of claim 26 wherein said conductive regions are gates of semiconductor integrated circuit devices.

37. The method of claim 26 wherein said spacer insulator layer is on said insulator liner layer.

38. A method of fabricating a self-aligned floating gate to active region structure comprising:
   providing a semiconductor region within a substrate extending to a surface,
   forming a gate insulator layer over said semiconductor region;
   forming, sequentially, a conductive layer and an insulator layer over said gate insulator layer;
   patterning said gate insulator layer; said conductive layer and said insulator layer to form
   a plurality of tiered parallel stripes;
   forming a spacer insulator layer over the sidewalls of said parallel stripes;
   forming trenches in said semiconductor region between said parallel stripes;
   growing an insulator liner layer over sides of said trenches and underlying said spacer insulator, and depositing an insulator filler layer so that said trenches and the space between said parallel stripes are filled with said insulator filler layer;
   planarizing so that said insulator filler layer above top of said insulator layer is removed;
   etching said filler layer so that it just fills said trenches;
   removing said insulator layer and said insulator spacer layer;
   patterning said conductive layer to form separated floating gates.

39. The method of claim 38 wherein said semiconductor region is a silicon region.

40. The method of claim 38 wherein said substrate is a silicon substrate.

41. The method of claim 38 wherein said gate insulator regions are oxide regions.

42. The method of claim 38 wherein said insulator liner layer is a grown oxide layer.

43. The method of claim 38 wherein said insulator filler layer is an HDP oxide layer.

44. The method of claim 38 wherein said floating gates are composed of doped polysilicon.

45. The method of claim 38 wherein said insulator layer is a nitride layer.

46. The method of claim 38 wherein said insulator spacer layer is a nitride layer.

47. The method of claim 38 wherein said planarizing is performed using CMP.

48. The method of claim 38 wherein said spacer insulator layer is on said insulator liner layer.

* * * * *